United States Patent [19]

Suhir

[11] Patent Number: 5,703,350
[45] Date of Patent: Dec. 30, 1997

[54] DATA CARRIERS HAVING AN INTEGRATED CIRCUIT UNIT

[75] Inventor: Ephraim Suhir, Randolph, N.J.

[73] Assignee: Lucent Technologies Inc., Murray Hill, N.J.

[21] Appl. No.: 551,241

[22] Filed: Oct. 31, 1995

[51] Int. Cl.$^6$ ............................ G06K 19/02; G06K 19/06
[52] U.S. Cl. ................................. 235/492; 235/488
[58] Field of Search ........................... 235/488, 492, 235/441, 380; 283/504, 83; 361/392, 400, 401

[56] References Cited

U.S. PATENT DOCUMENTS

| | | | |
|---|---|---|---|
| 4,417,415 | 11/1983 | Hoppe et al. | 235/488 |
| 4,460,825 | 7/1984 | Haghiri-Tehrani et al. | 235/488 |
| 4,463,971 | 8/1984 | Hoppe et al. | 283/83 |
| 4,841,134 | 6/1989 | Hida et al. | 235/488 |
| 4,897,534 | 1/1990 | Haghira-Tehrani | 235/492 X |
| 4,994,659 | 2/1991 | Yabe et al. | 235/492 |
| 5,057,679 | 10/1991 | Audic et al. | 235/488 X |
| 5,208,450 | 5/1993 | Uenishi et al. | 235/488 X |

FOREIGN PATENT DOCUMENTS

| | | | |
|---|---|---|---|
| 2595848 | 9/1987 | France | 235/488 |
| 3420051 | 12/1985 | Germany | 235/488 |
| 0111583 | 5/1991 | Japan | 235/488 |

*Primary Examiner*—Donald T. Hajec
*Assistant Examiner*—Thien Minh Le
*Attorney, Agent, or Firm*—Vernon E. Williams; Patricia A. Verlangieri

[57] ABSTRACT

Integrated circuits embedded in cards are known in the industry as "Smart Cards". The present invention discloses a novel design for housing an integrated circuit(IC) within a card unit. The integrated circuit is first made thin and placed in the midplane of the card. This lessens the tensile stress in the IC when the Smart Card is subjected to bending. In addition, it is suggested that the IC chip is then placed in a relatively long and wide enclosure. This second measure reduces the stress on the IC by compromising between the competing objectives of making a rigid cavity for IC protection, versus making a more compliant cavity for overall card strength. Lastly, the cavity is made out of a material that typically has a Young's modulus that is higher than the Young's modulus of the card but lower than Young's modulus of the integrated circuit. This once again increases Smart Card reliability by utilizing a harder cavity material to protect the IC.

27 Claims, 2 Drawing Sheets

SECTION 1-1

SECTION 4-4

DATA CARRIERS HAVING AN INTEGRATED CIRCUIT UNIT

TECHNICAL FIELD

This invention is directed to data carriers having an integrated circuit(IC) embedded therein.

CROSS-REFERENCE TO RELATED APPLICATION

Related subject matter is disclosed in the co-pending, commonly assigned U.S. patent application with assignee docket designation, Clifton-Flynn-Verdi 4-6-15, Ser. No 08/241,227, filed Oct. 5, 1994 now abandoned entitled "Smart Card Having a Thin Die".

BACKGROUND OF THE INVENTION

Data carriers with embedded integrated circuits are known throughout the industry as "Smart Cards". The Smart Card industry has significantly advanced as a result of the wide variety of applications available for the Smart Card. The cards can be used for diverse applications such as telephone cards, voter registration cards, health related applications. The wide variety of applications for these cards derive from the fact that they have an embedded integrated circuit chip, giving the cards a significant data storage capability.

As a result of the volume of cards required for an application, these cards are mass produced. Most Smart Cards are developed through a standard production process. The first step of the process is die bonding. In die bonding, the integrated circuit is bonded to a conductive film using an epoxy. The epoxy is given time to cure and then in a process known as wire bonding, conductive wires are connected between the integrated circuit and a conductive film. International Standard ISO/IEC 7816, which defines the size, thickness and contact arrangement of the card, allows for eight such connections; however recent circuits use only five. Once the connections have been made the integrated circuit and the connection wires are encapsulated in an epoxy resin. This resin is then ground flat and the entire circuit is punched out of the roll of conductive film. After the circuit is tested it is usually embedded in the top surface of the card, in a corner, toward the edge of the card.

In addition to the manufacturing hurdles, the card has stringent reliability requirements. Since these cards are often carried in a wallet or purse, the cards have to be able to withstand such adverse environments. Placing the Smart Card in a wallet and then placing the wallet in a purse or back pocket, subject the card to significant torquing moments within the plane of the card. These torquing moments deform the card and influence integrated circuit failure due to cracking. The failure caused by the stress on the integrated circuit has been identified as the primary cause of Smart Card malfunction. Furthermore, bending deformations have been found to be the primary cause of integrated circuit failure when compared with other causes of failure, such as thermal stress.

Where the integrated circuit is placed, and how the integrated circuit is contained, have also been found to contribute to Smart Card failure. FIG. 1 discloses a Smart Card 10 in the prior art. The integrated circuit 20, in the prior art Smart Card 10, is normally positioned within the boundaries of the Smart Card. The prior art Smart Card design, normally places the integrated circuit toward the top of the card, as displayed in the sectional view of FIG. 1, given in FIG. 2.

SUMMARY OF THE INVENTION

The present invention is directed to a Smart Card which protects an embedded integrated circuit from cracking failures, resulting from bending or deforming stresses. A thin integrated circuit (a circuit of 11 mils or less in thickness) is positioned within a cavity that is centered in the midplane of a card. The integrated circuit and the cavity are also centered by thickness, within horizontal midplane of the card. The cavity is sized to be several orders of magnitude bigger than the integrated circuit in thickness and length. In addition, the cavity is filled with a material that typically has a Young's modulus that is higher than the Young's modulus of the card material but lower than the Young's modulus of the integrated circuit material.

BRIEF DESCRIPTION OF THE DRAWINGS

The objects, advantages and novel features of the invention will be more fully apparent from the following detailed description when read in connection with the accompanying drawings wherein.

DETAILED DESCRIPTION OF THE INVENTION

The inventive technique reduces deforming stresses on an integrated circuit. A relatively thin integrated circuit (12 mils or less in thickness) is positioned in a cavity which is centered by thickness in a horizontal mid-plane of a card structure. Utilizing a thin integrated circuit lowers the bending stress on the circuit; and placing the thin integrated circuit within the midplane of the card, reduces the tensile resulting from bending of the card.

The integrated circuit is placed in a relatively long and thick cavity, which correlates with the length and thickness of the integrated circuit. For example, the cavity may be five times the length and three times the thickness of the integrated circuit. This provides a buffer for the integrated circuit to protect the circuit from bending moments on the card.

Lastly, the Young's modulus of the material that fills the cavity is typically made higher than the Young's modulus of the card material, but lower than the Young's of the integrated circuit material. This design feature, balances the competing objectives of providing a rigid enclosure which protects the integrated circuit, with a compliant enclosure, which gives greater local strength to the card structure and brings down stress concentration due to the dissimilar Young's moduli of the material. Therefore the inventive technique provides for local strength without compromising the overall strength of the card.

Figure 1:
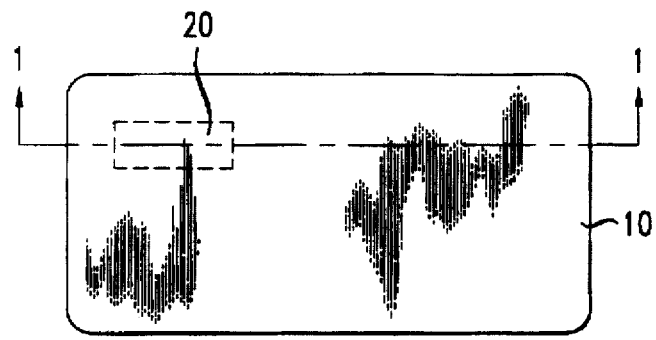
FIG. 1. displays a schematic of a Smart Card in the prior art.
Figure 2:
FIG. 2. displays a section view of the prior art Smart Card along sectional line 1—1.
Figure 3:
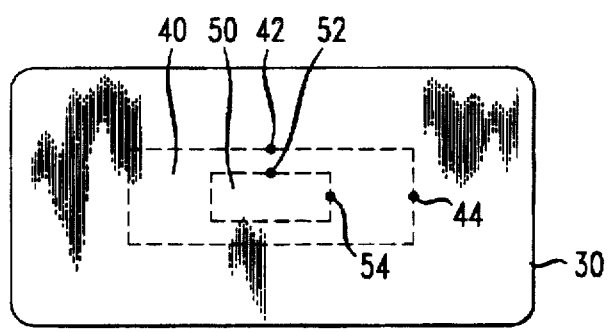
FIG. 3. displays a schematic of the Smart Card.

FIG. 3 displays a schematic view of a Smart Card 30, in which an integrated circuit 50 is placed within a cavity 40.

Figure 4:
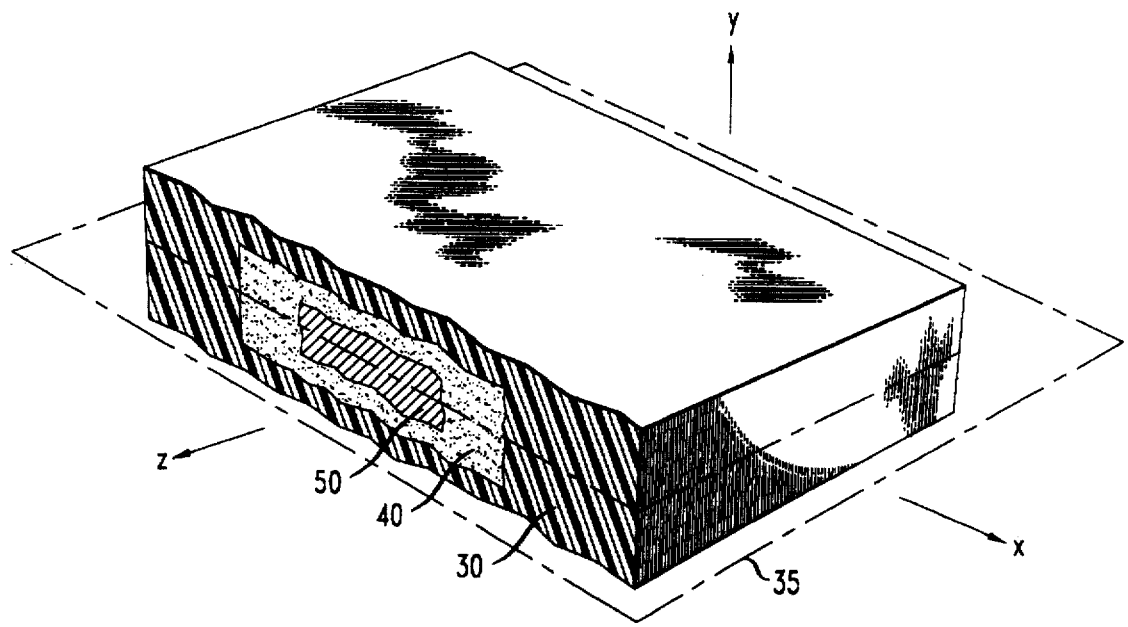
FIG. 4. displays a three dimensional cross sectional view of the Smart Card detailed in FIG. 3 taken along sectional line 4—4.

FIG. 4 denotes a three dimensional cross sectional view of the Smart Card in FIG. 3 taken along the sectional line 4—4. In FIG. 4 an x, y, and z axis are denoted to define the dimensions of the Smart Card 30. The y axis denotes the thickness of the card 30, the cavity 40, and the integrated circuit 50. The x axis denotes the length of the card 30, the cavity 40, and the integrated circuit 50. A horizontal midplane 35 is displayed. The horizontal midplane 35 bisects the thickness of the Smart Card and forms a plane in the y axis. In the present invention the thickness of the cavity 40 denoted by its y-dimension, is centered in the horizontal mid-plane 35 of the card, and the thickness of the chip 50 denoted by its y-dimension, is centered in the horizontal midplane 35. However, if the chip cannot be exactly centered by thickness within the mid-plane 35 it should off-center by a measurement of no greater than the thickness of the integrated circuit. For example, an integrated circuit with a thickness of 12 mils, should be off center by no more than plus or minus 12 mils in the positive or negative y direction. It should be appreciated that after the thickness of the cavity and the chip are centered in the mid-plane of the card, they can be positioned anywhere within midplane 35 of the card.

Figure 5:
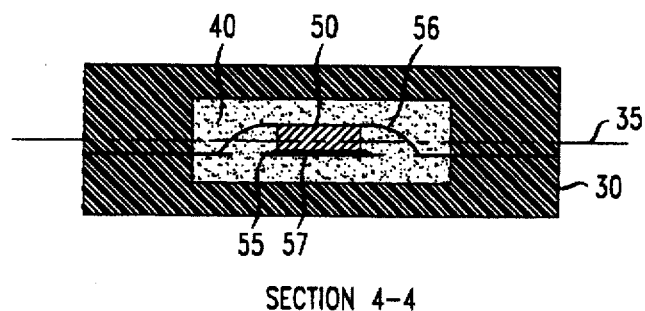
FIG. 5. displays the cross sectional view of the Smart Card detailed in FIG. 3 along line 4—4.

In FIG. 5 a cross-sectional view of the Smart Card 30 shown in FIG. 3 is displayed. The cross-sectional view is taken along line 4—4 of FIG. 3. In FIG. 5 the cavity 40 is centered in the horizontal midplane 35 of the card 30. The chip 50 is centered on the horizontal midplane 35 of the card and also centered in the cavity 40. The integrated circuit 50 is attached to a conductive film 55 with an epoxy resin 57. Wire connections 56 provide an electrical connection between the integrated circuit 50 and the conductive material 55.

As disclosed above it is advantageous to size the cavity relative to the chip. The cavity 40 should be thicker than the integrated circuit 50 by a range of 1.5:1 to 6:1. Therefore the integrated circuit 50, should be relatively thin. One embodiment of the invention, a tighter range of 2:1 to 4:1 would be advantageous. For example, the thickness of the cavity may be 12 mils while the thickness of the integrated circuit would be approximately 12 mils, corresponding to a 2:1 ratio.

In addition to placing the integrated circuit of FIG. 4 in a cavity with the proper relative dimensions; positioning the integrated circuit 50 in the midplane of the cavity 40 is found to significantly reduce the stress. In FIG. 5 a Smart Card 30 which has a filled cavity 40, houses an integrated circuit 50. The filled cavity 40 is filled with a compliant material such as a polymeric material e.g. an epoxy molding compound. The integrated circuit 50 is made from a material such as silicon. The card 30 is made from a multi-layer composite material. The Young's modulus of the material that fills the cavity should be higher than the Young's modulus of the card material but lower than the Young's modulus of the integrated material. Therefore, the Young's modulus of the epoxy molding compound is higher than the Young' modulus of the multi-layer composite but lower than the Young's modulus of silicon. It should be appreciated that any materials that provides the Young's modulus relationship defined, would be suitable. The definable limits of the Young's modulus relationship would change depending on how the integrated circuit was specifically positioned in the cavity. In the embodiment presented below the Young's modulus was between about $0.4 \times 10^6$ psi and $17.5 \times 10^6$ psi.

An analysis of how the length and the thickness of the cavity 20 affects the stress at different points on the integrated circuit is provided. Measurements were taken at two locations on the integrated circuit, denoted by 52 and 54 in FIG. 3, and on two locations on the cavity, denoted by 42 and 44 in FIG. 3. Table I given below, details the stress at these different locations, for a cavity of a given size, as the Young's modulus of the material that fills the cavity is varied.

Table I was generated using a configuration representing one embodiment of the invention, in which an integrated circuit with thickness of 6 mils, length of 2.54 mm, a Young's modulus(E) of $0.4 \times 10^6$ psi, and a poisson's ratio(v) of 0.24 k, was used. This integrated circuit was housed in a card with a thickness of 0.9144 mm, a length of 7.62 mm, E of $17.5 \times 10^6$ psi, and poisson's ratio v=0.4. These dimensions were kept constant while the size and Young's modulus of the material in the cavity was varied. In each of the cases tested, the external bending moment on the card was M=1 lb×0.9144 mm=0.416 kgf×mm. The Young's modulus of the cavity material, varied between $0.1 \times 10^6$ psi to $17.5 \times 10^6$ psi, to represent a suitable material such as silicon.

The data which resulted from analyzing this embodiment is displayed below, in which the columns indicate:

1. Young's modulus of the material of the enclosure, psi.
2. Maximum normal (bending) stress in the IC at the point designated by 52 in FIG. 3.
3. Von-Mises stress in the IC at the point designated by 52 in FIG. 3.
4. Von-Mises stress in the IC at the point designated by 54 in FIG. 3.
5. Von-Mises stress in the card at the point designated by 42 in FIG. 3.
6. Von-Mises stress in the card at the point designated by 44 in FIG. 3.
7. Maximum deflection of the IC, in inches.

TABLE I

| E of the Cavity Psi (1) | sigma 1 Psi (2) | VM1 Psi (3) | VM2 Psi (4) | VM3 Psi (5) | VM4 Psi (6) | Deflection 2 In (7) |
|---|---|---|---|---|---|---|
| Cavity with Two Times Length & Two Times Thickness | | | | | | |
| 1.0e+05 | 377 | 312 | 19 | 62 | 31 | −1.8e−5 |
| 1.75e+07 | 182 | 152 | 604 | 77 | 46 | −9.0e−6 |
| Cavity with Two Times length & three times Thickness | | | | | | |
| 1.0e+0.5 | 400 | 330 | 21 | 104 | 29 | −1.9e−5 |
| 1.75e+07 | 86 | 77 | 247 | 110 | 38 | −4.0e−6 |
| Cavity with Three Times Length & Three Times Thickness | | | | | | |
| 1.0e+0.5 | 400 | 330 | 21 | 104 | 29 | −1.9e−5 |
| 1.75e+07 | 86 | 77 | 247 | 110 | 38 | −4.0e−6 |
| Cavity with Three Times Length & Two Times Thickness | | | | | | |
| 1.0e+0.5 | 377 | 312 | 15 | 62 | 31 | −1.8e−5 |
| 1.75e+07 | 182 | 152 | 613 | 76 | 45 | −9.0e−6 |
| Cavity with Three Times Length &.Three Times Thickness | | | | | | |
| 1.0e+0.5 | 401 | 330 | 17 | 102 | 30 | −1.9e−5 |
| 1.75e+07 | 86 | 77 | 249 | 107 | 37 | −4.0e−6 |
| Cavity with Three Times Length & Five Times Thickness | | | | | | |
| 1.0e+0.5 | 613 | 502 | 29 | 143 | 38 | −2.7e−5 |
| 1.75e+07 | 30 | 34 | 68 | 101 | 31 | −1.0e−6 |
| Cavity with Five Times Length & Five Times Thickness | | | | | | |
| 1.0e+0.5 | 614 | 503 | 25 | 146 | 39 | −2.7e−5 |
| 1.75e+07 | 30 | 34 | 68 | 100 | 31 | −1.0e−6 |

As detailed in Table I, the stresses on both the cavity and the integrated circuit decrease as the dimensions and Young's modulus of the cavity material are increased. For example, when the cavity is double the length and thickness of the integrated circuit, the maximum bending stress on the integrated circuit and the Von-Mises stress at the point denoted by 52 in FIG. 3, experience a decrease from 377 psi to 182 psi and from 312 psi to 194 psi, respectively. However, the Von-Mises stress at the points denoted by points 54, 42, and 44 of FIG. 3, all experience an increase in stress. The point denoted by 54 increases from 18 psi to 604 psi, the point denoted by 42 increases from 62 psi to 77 psi, and lastly, and the point denoted by 44 increases from 31 psi to 46 psi. Therefore, with a cavity that is two times the length and two times the thickness of the integrated circuit, while there is some decrease in stress, there is more of an increase in the stress on the integrated circuit and the cavity.

There is an appreciable difference when a cavity that is twice the length and thickness of the integrated circuit, is compared with one that is five times the length and thickness of the integrated circuit. With the larger cavity, the maximum bending stress, denoted by 52 in FIG. 3, and the von-mises stress denoted by 54, 42, and 44 in FIG. 3 all experience a decrease. Therefore, the dam shown in Table I, details that stress on the integrated circuit 30, is reduced when the length of the cavity 20, is greater than the length of the integrated circuit 30, in a ratio of between 2:1 to 6:1 (preferably 2:1 to 4:1). As an example, the length of the cavity 20 might be 300 mils, while the integrated circuit would be 100 mils, corresponding to a 3:1 ratio.

Figure 6:
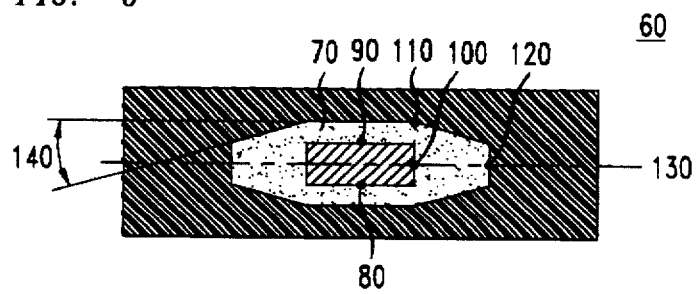
FIG. 6. displays a cross-sectional view of an alternate embodiment of the Smart Card in which the corners of the cavity are truncated.

In FIG. 6 the Smart Card 60 houses, an integrated circuit 80, in a truncated cavity 70. The truncated cavity is slanted at the edges by an angle denoted by 140. The truncated cavity in TABLE II given below, is slanted at ¼, ½, and ⅔. These designations, correspond to creating the angle 140, by traversing from the point denoted as 110, four units in the horizontal plane for one unit in the vertical plane(¼), two units in the horizontal plane for one unit in the vertical plane(½), and three units in the horizontal plane for two unit in the vertical plane(⅔). Stress points are measured in the cavity and displayed in TABLE II given below in which 90, 100, 110 and 120 of FIG. 6; correspond to VM1, VM2, VM3, and VM4, respectively.

TABLE II

| E of the Cavity Psi | Sigma 1 Psi | VM1 Psi | VM2 Psi | VM3 Psi | VM4 Psi | Deflection 2 In |
|---|---|---|---|---|---|---|
| Cavity Three Times Length & Five Times Thickness (Slanted @ ¼) | | | | | | |
| 1.0e+0.5 | 613 | 503 | 29 | 184 | 72 | −2.7e−5 |
| : | : | : | : | : | : | : |
| 1.75e+07 | 30 | 34 | 67 | 6 | 66 | −1.0e−6 |
| Cavity Three Times Length & Five Times Thickness (Slanted @ ½) | | | | | | |
| 1.0e+0.5 | 613 | 503 | 29 | 174 | 72 | −2.7e−5 |
| : | : | : | : | : | : | : |
| 1.75e+07 | 30 | 34 | 68 | 12 | 73 | −1.0e−6 |
| Cavity Three Times Length & Five Times Thickness (Slanted @ ¾) | | | | | | |
| 1.0e+0.5 | 614 | 503 | 29 | 147 | 70 | −2.7e−5 |
| : | : | : | : | : | : | : |
| 1.75e+07 | 30 | 34 | 68 | 60 | 77 | −1.0e−6 |

The adverse effects of raising the Young's modulus in the cavity is significantly decreased by utilizing a truncated cavity. Comparing Table II to Table I for the case of a cavity with three times the length and five times the thickness, the stress readings are almost identical for the truncated cavity slanted at ¼. In addition, Table II shows in a tabular form, that changing the angle 140 of FIG. 6, of the truncated cavity 70, has a relatively small effect on the stress on the integrated circuit. A lower degree of slanting causes lower flexible rigidity of the cavity, which results in lower bending stresses in the card material. However, as displayed in Table II, this causes greater bending stress on the integrated circuit. At ¼, most of the parameters experience a decrease in stress with the exception of VM2 which experiences an increase from 29 psi to 68 psi. However, comparing this to a slant of ½, or ¾ there is an increase at the points denoted by VM2 and VM4. Therefore ¼ slanting is used in the preferred embodiment of the invention.

As a final issue, increasing the Young's modulus results in lower stress on the integrated circuit. When a very high Young's modulus is used, there is an adverse effect on the card and the cavity material. However, as detailed in TABLE III given below, the favorable effect on the integrated circuit, outweighs the adverse effect on the card and the cavity material. This is detailed in TABLE III for both the slanted and nonslanted case. In Table III as the Young's modulus increases from 2.1e+0.6 to 5.0e+06, all the parameters except for VM1 decrease, and VM1(the stress on the upper right hand corner of the integrated circuit) increases only slightly from 66 psi to 67 psi.

TABLE III

Effects and Variations of Modulus of Elasticity on Normal and von Mises Stresses and Deflection

| E of the Cavity Psi | Sigma 1 Psi | VM1 Psi | VM2 Psi | VM3 Psi | VM4 Psi | Deflection 2 In |
|---|---|---|---|---|---|---|
| Cavity with Three Times Length & Five Times Thickness | | | | | | |
| 2.1e+06 | 119 | 110 | 66 | 107 | 36 | −6.0e−6 |
| : | : | : | : | : | : | : |
| 5.0e+06 | 67 | 69 | 67 | 104 | 34 | −3.0e−6 |
| Cavity with Three Times Length & Five Times Thickness (Slanted @ ¼) | | | | | | |
| 2.1e+05 | 119 | 110 | 66 | 39 | 69 | −6.0e−6 |
| : | : | : | : | : | : | : |
| 5.0e+06 | 67 | 69 | 67 | 18 | 66 | −3.0e−6 |

While several embodiments of the invention are disclosed and described, it should be appreciated that various modifications may be made without departing from the spirit of the invention or the scope of the subjoined claims.

What is claimed is:

1. A data carrier, comprising:
    a card composed of a material having a Young's modulus, said card including a horizontal midplane therein,
    a cavity filled with a material having a Young's modulus and including a length, and a thickness, wherein said cavity is positioned by said thickness in said horizontal midplane of the card, and
    an integrated circuit composed of a material having a Young's modulus, said integrated circuit including a length and a thickness of less than 12 mils, located in said cavity and positioned by said thickness in the horizontal midplane of said card, wherein said Young's modulus of said cavity material is higher than the Young's modulus of said card and lower than the Young's modulus of said material in said integrated circuit.

2. A data carrier as claimed in claim 1 wherein said integrated circuit is centered by said thickness in the horizontal mid-plane of said card.

3. A data carrier as claimed in claim 1 wherein said cavity is centered by said thickness in the horizontal midplane of said card.

4. A data carrier as claimed in claim 1 wherein said integrated circuit is off center by no greater than said thickness of the integrated circuit.

5. A data carrier as claimed in claim 1 wherein said cavity is off center.

6. A data carrier as claimed in claim 3 wherein said integrated circuit is centered by said thickness within the horizontal mid-plane of the card.

7. A data carrier as claimed in claim 1 wherein said cavity is centered by said length and by said thickness in the horizontal midplane of said card.

8. A data carrier as claimed in claim 7 wherein said integrated circuit is centered by said length and by said thickness in said cavity.

9. A data carrier as claimed in claim 1 wherein a ratio of the length of said cavity to the length of said integrated circuit is between about 2:1 to about 6:1.

10. A data carrier as claimed in claim 1 wherein, a ratio of the thickness of said cavity to the thickness of said integrated circuit is between about 1.5:1 to about 6:1.

11. A data carrier as claimed in claim 9 wherein said ratio is between about 2:1 to about 4:1.

12. A data carrier as claimed in claim 10 wherein said ratio is between about 2:1 to about 4:1.

13. A data carrier as claimed in claim 6 wherein the length of said cavity is three times greater than the length of said integrated circuit and the thickness of the cavity is five times greater than the thickness of said integrated circuit.

14. A data carrier as claimed in claim 1, wherein the Young's modulus of said cavity material is between about $0.4 \times 10^6$ psi and about $7.5 \times 10^6$ psi.

15. A data carrier as claimed in claim 1 wherein said material of said card is a multi-layer composite.

16. A data carrier as claimed in claim 1 wherein said material in said cavity is an epoxy resin.

17. A data carrier as claimed in claim 1 wherein said integrated circuit material is silicon.

18. A data carrier, comprising:

a card composed of a material having a Young's modulus and including a horizontal midplane therein, a truncated cavity filled with a material having a Young's modulus and including a thickness, wherein said truncated cavity is positioned by thickness in the horizontal midplane of said card, and an integrated circuit located in said truncated cavity and including a thickness of less than 6 mils wherein said integrated circuit is positioned by thickness in the horizontal midplane of said card and wherein said Young's modulus of said truncated cavity material is higher than the Young's modulus of said card and lower than the Young's modulus of said material in said integrated circuit.

19. A data carrier as claimed in claim 18 wherein said integrated circuit is centered by said thickness in the horizontal mid-plane of said card.

20. A data carrier as claimed in claim 19 wherein said integrated circuit is off center by no more than said thickness of the integrated circuit.

21. A data carrier as claimed in claim 20 wherein said truncated cavity is centered by thickness in the horizontal mid-plane of said card.

22. A data carrier as claimed in claim 21 wherein said integrated circuit is centered in the horizontal mid-plane of the card.

23. A data carrier as claimed in claim 18 wherein said truncated cavity is truncated at about $11/14$.

24. A data carrier as claimed in claim 18 wherein said truncated cavity is truncated at about $2/3$.

25. A data carrier as claimed in claim 18 wherein said truncated cavity is truncated at about $1/2$.

26. A data carrier as claimed in claim 22 wherein said truncated cavity is three times the length of said integrated circuit and five times the thickness of said integrated circuit.

27. A data carrier, comprising:

a card including a thickness of 0.9144 mm, a length of 7.62 mm, Young's modulus of $0.4 \times 10^6$ psi, a poisson's ratio of 0.4, and a horizontal midplane therein, a cavity having a thickness and filled with a material having Young's modulus between about $0.1 \times 10^6$ psi to about $17.5 \times 10^6$ psi, wherein said cavity is centered by thickness in the horizontal midplane of said card, and an integrated circuit including a thickness of 6 mils, a length of 2.54 mm, a Young's modulus of $17.5 \times 10^6$ psi and a poisson's ratio of 0.24 k, positioned in said cavity and centered by thickness in the horizontal midplane of said card.

\* \* \* \* \*